United States Patent [19]
Pradhan et al.

[11] Patent Number: 5,491,705
[45] Date of Patent: Feb. 13, 1996

[54] DE BRUIJN GRAPH BASED VLSI VITERBI DECODER

[75] Inventors: Dhiraj K. Pradhan; Nitin H. Vaidya, both of Amherst, Mass.

[73] Assignee: The United States of America as represented by the Secretary of the Air Force, Washington, D.C.

[21] Appl. No.: 904,341

[22] Filed: Jun. 18, 1992

[51] Int. Cl.$^6$ ............................................. H03M 13/12
[52] U.S. Cl. ............................................. 371/43
[58] Field of Search .................. 371/43, 32, 35, 371/37.4, 39.1, 37.8

[56] References Cited

U.S. PATENT DOCUMENTS

| | | | |
|---|---|---|---|
| 3,789,360 | 1/1974 | Clark, Jr. et al. | 340/146.1 AQ |
| 4,015,238 | 3/1977 | Davis | 340/146.1 AQ |
| 4,240,156 | 12/1980 | Doland | 371/43 |
| 4,354,269 | 10/1982 | Vries et al. | 371/43 |
| 4,486,882 | 12/1984 | Piret et al. | 371/45 |
| 4,493,082 | 1/1985 | Cumberton et al. | 371/43 |
| 4,500,994 | 2/1985 | McCallister et al. | 371/43 |
| 4,545,054 | 10/1985 | Davis | 371/43 |
| 4,581,601 | 4/1986 | Calderbank et al. | 340/347 DD |
| 4,606,027 | 8/1986 | Otani | 371/43 |
| 4,630,032 | 12/1986 | Gordon et al. | 340/347 DD |
| 4,710,746 | 12/1987 | Shimoda et al. | 340/347 DD |
| 4,715,037 | 12/1987 | Yagi | 371/43 |
| 4,730,322 | 3/1988 | Pollara-Bozzola | 371/43 |
| 4,748,626 | 5/1988 | Wong | 371/30 |
| 4,888,775 | 12/1989 | Karabed et al. | 371/43 |
| 5,068,859 | 11/1991 | Collins et al. | 371/43 |
| 5,150,381 | 9/1992 | Forney, Jr. et al. | 375/39 |

OTHER PUBLICATIONS

Fourney, G. David Jr., "The Viterbi Algorithm", Proceedings of the IEEE, vol. 61, No. 3, Mar. 1973, pp. 268–278.

Samatham, Maheswara R. et al., "The De Bruijn Multiprocessor Network: A Versatile Parallel Processing and Sorting Network For VLSI", IEEE Transactions on Computers, vol. 38, No. 4, Apr. 1989, pp. 567–581.

Shung et al, "Area–Efficient Architectures for the Viterbi Algorithm", 1990 IEEE, 901.5.1–901.5.7.

Gulak et al, "Locally Connected VLSI architecture for the Viterbi algorithm." IEEE J. Selected Areas in Communications, 6:527–537, Apr. 1988.

Gulak et al, VLSI Structures For Viterbi Receivers:Part–i–general theory and applications, IEEE J. Selected A. in Comm., 4:142–154, Jan. 1986.

*Primary Examiner*—Stephen M. Baker
*Assistant Examiner*—Cameron H. Tousi
*Attorney, Agent, or Firm*—William G. Auton; Irwin P. Garfinkle

[57] ABSTRACT

The disclosed system uses a binary tree which is embedded in a De Bruijn graph to sort the survivor paths based on their path metrics. The system includes a sorting algorithm which is implemented in a pipelined fashion. The same communication structure underlining the De Bruijn graph is used, so that no additional communication overhead is required for sorting. The system implementation is parallel resulting in a high throughput.

1 Claim, 3 Drawing Sheets

DE BRUIJN ARCHITECTURE

DE BRUIJN ARCHITECTURE

FIG. 6
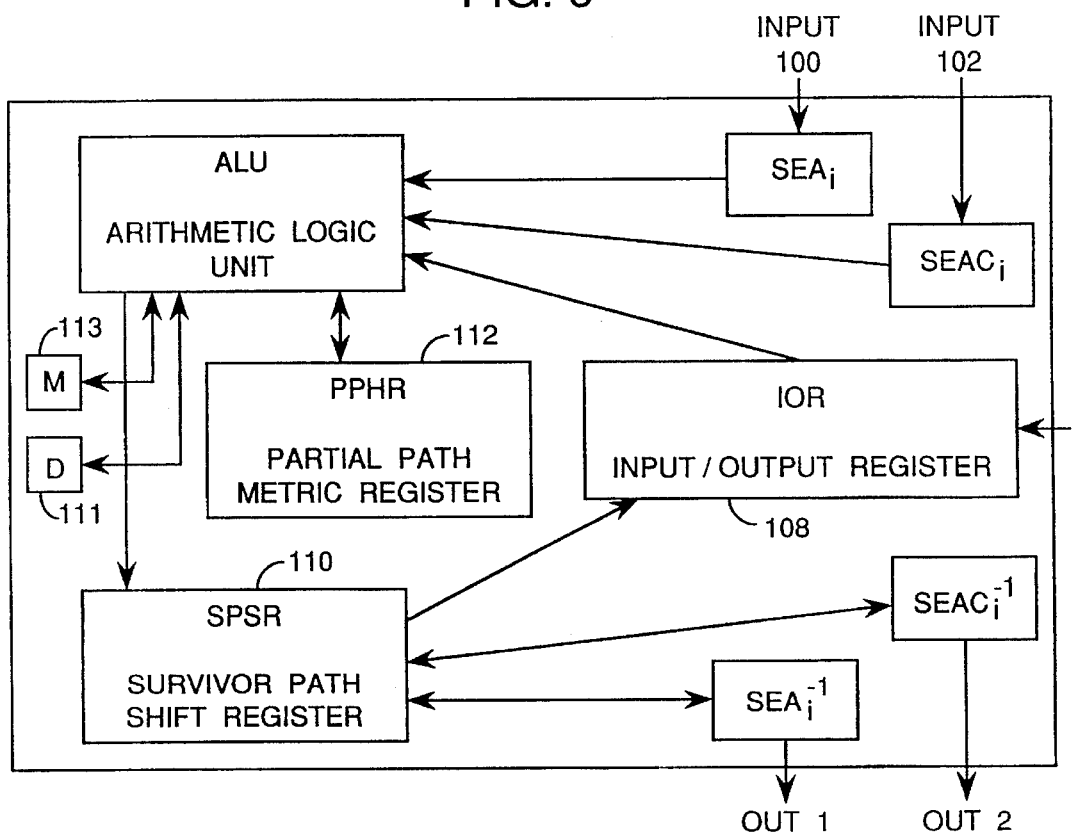
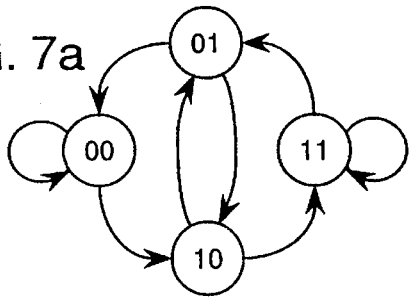
FIG. 7a  DE BRUIJN GRAPH
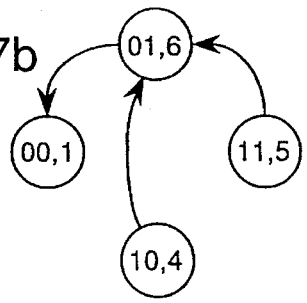
FIG. 7b  BINARY TREE EMBEDDING
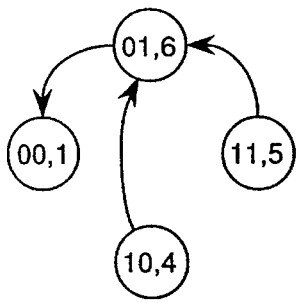
FIG. 8a
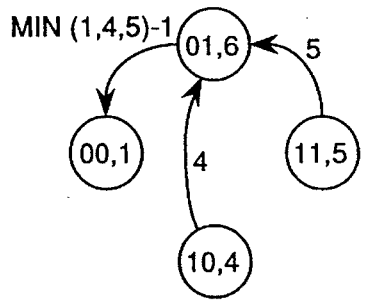
FIG. 8b
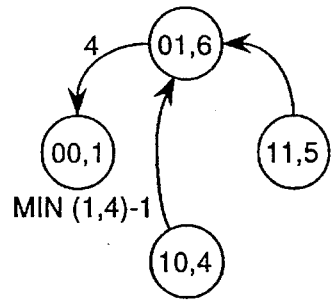
FIG. 8c

DE BRUIJN GRAPH BASED VLSI VITERBI DECODER

STATEMENT OF GOVERNMENT INTEREST

The invention described herein may be manufactured and used by or for the Government for governmental purposes without the payment of any royalty thereon.

The present invention provides a Viterbi decoder based on the De Bruijn graph. In essence, this invention involves the embedding a Viterbi algorithm in an architecture based on the De Bruijn network.

BACKGROUND OF THE INVENTION

A Viterbi decoder determines a maximum likelihood path through a trellis created by a convolutional decoder. Use of a binary tree structure embedded within the De Bruijn graph implements the maximum likelihood decoding of convolutional codes. The system uses a pipelined algorithm for finding the smallest metric.

The Viterbi algorithm produces an output by finding the survivor path with the smallest metric. The smallest metric is found by sorting the performance metrics of all the survivor paths. This strategy has a better probability of correct decoding compared to the strategies that choose an arbitrary survivor path. The improvement is achieved with minimal hardware overhead. For a detailed description of convolutional codes and the Viterbi decoders, refer to a paper entitled The Viterbi Algorithm, by G. David Forney, Jr., published in the proceeding of the IEEE, Vol. 61, No. 3, March 3, 1973, Pages 268–278. For a description of the De Bruijn graph, see article entitled The De Bruijn Multiprocessor Network: A Versatile Parallel Processing and Sorting Network for VLSI, by Samatham and Pradhan, IEEE Transactions on Computers, Vol. 38, No. 4, April 1989, which article is incorporated herein by reference. Copies of both papers are included in the information disclosure documents, .and is incorporated herein by reference.

PRIOR ART

A search of the prior art revealed the following United States Patents:

Doland U.S. Pat. No. 4,240,156 includes an error correcting system which uses a modified Viterbi decoder.

Calderbank U.S. Pat. No. 4,581,601 includes a system for multi-dimensional coding for error reduction in communication paths.

Otani U.S. Pat. Nos. 4,606,027 and Gordon et al 4,630,032 include an error correction system which uses a Viterbi decoder.

Shimoda et al U.S. Pat. No. 4,710,746 includes a sequential decoding device concerned with monitoring a communications path metric value.

The Wong Patent No. 4,748,626 includes a Viterbi decoder which determines a maximum likelihood communications path through a trellis of surviving paths. An article by Forney, Jr. entitled The Viterbi Algorithm, published in the Proceedings of the IEEE, Vol. 61, No. 3, March 1973 describes the theory and operation of the Viterbi decoder, and is incorporated herein by reference.

An article by Samatham and Pradhan, entitled The De Bruijn Multiprocessor Network: A versatile Parallel Processing and Sorting Network for the VLSI, published in the IEEE Transaction on Computers, Vol. 38, No. 4, April 1989 describes the theory and operation of the De Bruijn Network and is incorporated herein by reference.

SUMMARY OF THE INVENTION

The proposed algorithm uses a binary tree embedded in the De Bruijn graph to sort the survivor paths based on their path metrics. The sorting algorithm is implemented in a pipelined fashion. As the same communication structure underlining the De Bruijn graph is used, no additional communication overhead is required for sorting. The algorithm implementation is parallel resulting in a high throughput.

OBJECTS OF THE INVENTION

It is the object of this invention to provide a system for determining the survivor path with the smallest metric in a Viterbi trellis.

Another object of this invention is to find the smallest metric in a survivor path by embedding a Viterbi trellis in a De Bruijn graph.

Still another object of this invention is to embed a binary spanning tree in a directed binary De Bruijn graph.

Another object of this invention is to find the smallest metric without penalizing performance by using a pipelined algorithm.

BRIEF DESCRIPTION OF THE DRAWINGS

For further objects, and for a better understanding of the nature of this invention, reference should now be made to the following specification and to the accompanying drawings in which:

FIG. 6 illustrates the processor architecture incorporated in each of the nodes of the De Bruijn graph;

FIGS. 7a–b illustrate the embedding of a binary tree within the De Bruijn graph; and FIG. 8a–c are series of graphs illustrating the finding of the smallest metric.

DESCRIPTION OF A PREFERRED EMBODIMENT OF THE INVENTION

Convolutional codes differ from block codes in that the encoder memory and the encoder outputs at any given time unit depend not only on the k inputs at that time unit, but also on m previous input blocks. An (n,k,m) convolutional code can be implemented with a k-input, n-output linear sequential circuit with input memory m. Typically, n and k are small integers with k<n. In the important case when k=1, the information sequence is not divided into blocks and can be processed continuously.

In the following example, illustrated in FIG. 1, the number of inputs, k, is equal to one.

Figure 1:
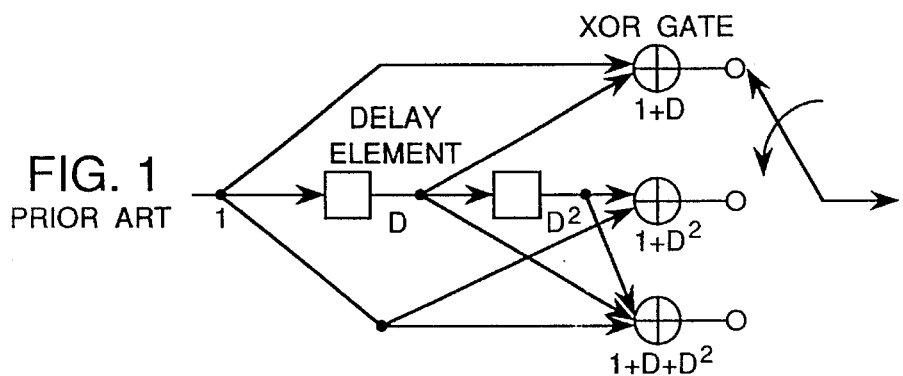
FIG. 1 illustrates a typical prior art encoder.

FIG. 1 illustrates a typical prior art encoder for (n,k,m) =(3,1,2) convolutional code with generator matrix $$G(D)=(I+D,\ i+D^2i+D+D^2)$$

The diagram in FIG. 1 shows a conventional encoder having a single data input (k=1), first and second delay elements D and $D^2$ (m=2), three XOR gates 10, 12 and 14. The three outputs (n=3) from the gates are supplied to three output terminals 11, 13 and 15, respectively. The output n, is serialized by means of the switch 17.

Initially the delay elements D and $D^2$ are set to 0. By way of example, with the matrix shown in FIG. 1, an input of 11000 applied sequentially to the single input k, would result in an output of:

111, 010, 110, 011, 000, 000, 000.

That is, in the above code, code vector for data (1 1 0 0 0) is: 111, 010, 110, 011, 000, 000, 000, the first five blocks representing data, the last 2 blocks serving to reset the delays D and $D^2$ to 0. This data must now be decoded, and for that purpose a Viterbi decoder is used. If the Viterbi decoder detects an error in one or more blocks of received data, the function of the decoder is to determine the correct data, i.e., 0 or 1.

Figure 2:
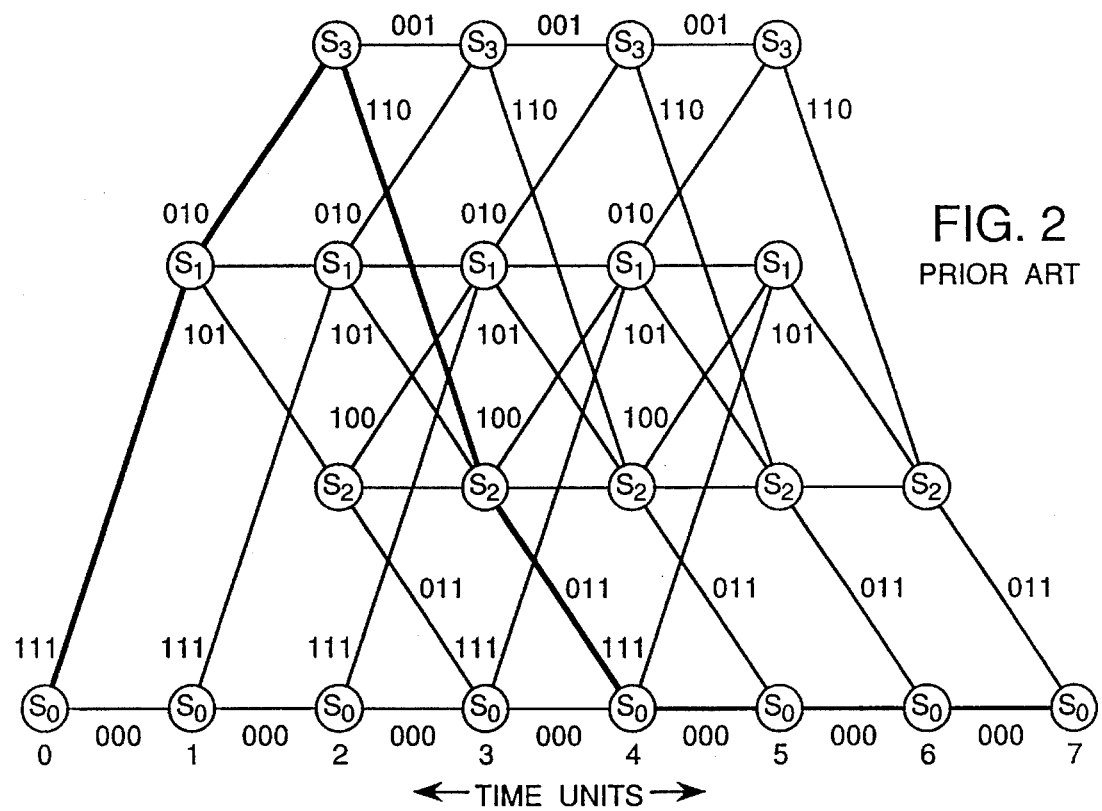
FIG. 2 is a prior art Viterbi Trellis Diagram.

The logic of the prior art Viterbi decoder is established by a Trellis diagram of the type shown in FIG. 2. A trellis diagram is obtained by expanding in time, the state diagram of the convolutional encoder shown in FIG. 1. The trellis diagram corresponding to an input sequence of length L consists of L+m+1 time units. Each state, S0 to S3, of the Trellis diagram corresponds to a state of the encoder of FIG. 1, i.e, the state of the delay elements D and $D^2$.

FIG. 2 shows the Trellis diagram for the (3,1,2) code of FIG. 1 and information sequence (11000) of length L=5. Each state, S0–S3 corresponds to the contents of the two delay elements D1 and D2 in the encoder. Thus state S0=00, state S1=10, state S2=01, and state S3=11. The arcs .(i.e., the lines interconnecting the states S0 to S3) on the right side of a state are considered going out of the state, and the arcs on the left side of a state are considered to be entering the state. There are two arcs going out from each state. Of these two arcs, the upper outgoing arc corresponds to input value 1, and the lower outgoing arc corresponds to input value 0. The label on the upper outgoing arc and any particular state SP corresponds to the encoder output when input 1 is received with the encoder being in state Sp. Similarly, the label on the lower outgoing arc at state Sp corresponds to the encoder output when input 0 is received with the encoder being in the state Sp.

In general, the Trellis diagram for an (n,l,m) convolutional code has $2^m$ states that are repeated over time. As noted before, the example of FIG. 2 has four states corresponding to a (3,1,2) code.

When data is encoded into a convolutional code, the encoder traces a path in the Trellis diagram. For example, FIG. 2 illustrates the path traced by the encoder in FIG. 1 when the input sequence is (11000). When the data is to be recovered from the received codeword, the decoder takes the received codeword as its input and tries to determine the path followed by the encoder. Once the path followed by the encoder is determined, the corresponding input data can also be determined.

The Viterbi algorithm assumes (1) that the encoder has an m-time unit memory; (2) the code input has L code blocks of n bits each. The metric of a path entering a state of the trellis is a measure of the estimated correlation between the correct path, and the path that was actually followed by the encoder. The metric is evaluated such that a lower metric implies a higher correlation, and vice versa.

The Viterbi algorithm is presented below by way of example. The algorithm, when applied to the received sequence finds the path through the trellis with the smallest metric. The input sequence is processed one block at a time. At each step, the algorithm compares the paths entering each state, and stores the path with the smallest metric, called the survivor path, together with its metric.

EXAMPLE OF THE VITERBI ALGORITHM

Step 1: Beginning at time j=m, compute the partial metric for the single path entering each state. Store the survivor path and it metric for each state.

Step 2: Increment j by 1. Compute the partial metric for the two paths entering a state by adding the branch metric entering that state to the metric of the connecting survivor at the preceding time. For each state, store the survivor path together with its metric, and discard the other path.

Step 3: If j is less than L=m, repeat step 2, otherwise, stop. At the end of the algorithm, the survivor path stored in the all-zero state 0, is the maximum-likelihood path.

Issues related to implementation make storing the survivor paths impractical when L is large. The approach usually taken is to truncate the path memory of the decoder by storing only the most recent T blocks of information bits for each survivor path, for some integer T. Hence after the first T blocks of the received sequence have been processed by the decoder, the decoder memory is full. After the next block is processed, a decoding decision must be made on the first information bit, since it can no longer be stored in the decoder's memory. The survivor path with the best metric is selected, and the first bit on this path is chosen as the decoded bit. After the first decoding decision is made, additional decisions are made in the same way for each new received block processed.

Figure 3A:
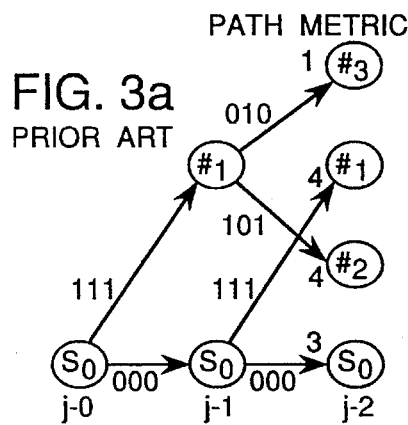
FIGS. 3a–e illustrate an example of Viterbi decoding in a Trellis diagram.

The procedure followed by the decoder to determine the path is now illustrated with an example:

Example: Consider the Trellis diagram of FIG. 2 and let the codeword received by the decoder be (110, 010, 110, 011, 000, 000). As the Trellis diagram is for an (3,1,2) code, m=2. Also let r=3 be the survivor path memory size, At j=m=2, the metric for each path entering the four states is shown in FIG. 3(a). The metric for the path entering state $S_1$ is 4 because the number of differing bits in first two blocks of the received sequence 110 010 and the blocks marked on the two arcs leading to state $S_1$, 000 111, is four. The paths entering the states at j=m=2 are the survivors paths at those states, respectively.

Figure 3B:
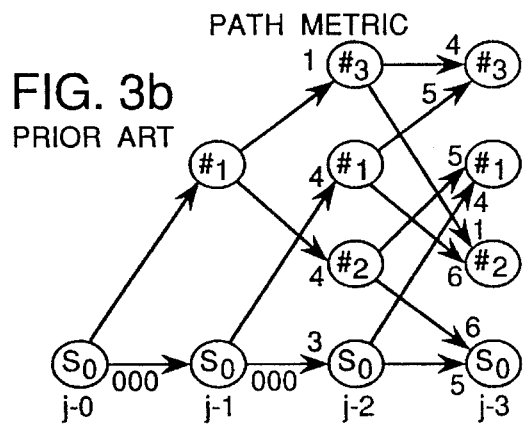
Figure 3C:
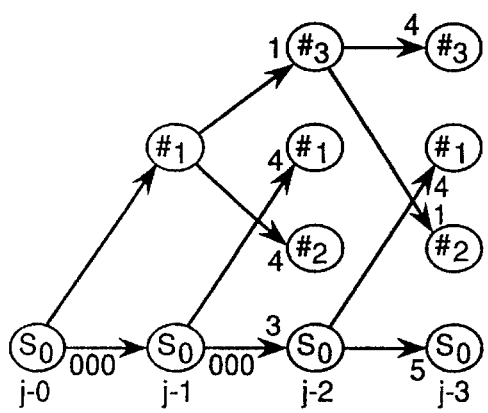

At j=3, the received block of code is 110. The metrics for each path entering the states is shown in FIG. 3(b). The metrics for the paths entering state $S_1$ are calculated as follows. The two arcs entering $S_1$ are from states $S_2$ and $S_0$. The metric of the path from $S_2$ to $S_1$ is given by the sum of the metric of the survivor path at state $S_2$ (the metric is 4) and the number of bits differing between the received code block 110 and the block written on the arc from $S_2$ to $S_1$ (the number of differing bits is 1). Therefore, the metric of the path from $S_2$ to $S_1$ is 5. Similarly, the path metrics for all the paths are found. FIG. 3(c) shows the survivor paths at each state at j=3. The survivor path at any state is the path entering the state with the smallest metric, ties being resolved arbitrarily. As r=3, at j=3 the survivor path memory in each state is full. At the next increment of j, a decision on the first bit of decoded information must be made.

Figure 3D:
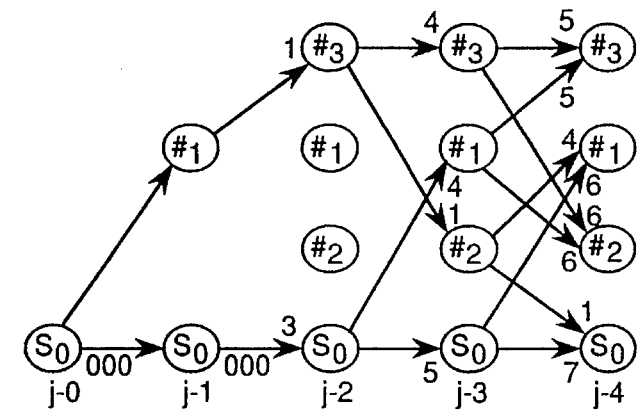

At j=4, similar to above, the survivor paths are determined for each state. The survivor paths of length 4 are shown in FIG. 3(d). Note that as r=3, these paths cannot be stored completely. Now the metrics for the survivor paths at states $S_0$, $S_1$, $S_2$, $S_3$ and 1, 4, 6 and 5 respectively.

Figure 3E:
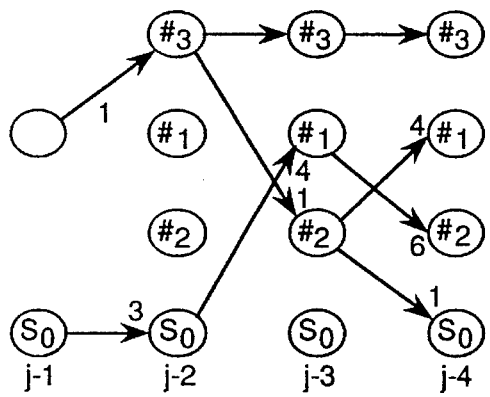

The minimum of the metrics of the survivor paths entering the four states is found. The survivor path entering state 0 has metric 1 which is the smallest. Thus, the first decoded bit corresponds to the first arc on the survivor path at state 0. As the first arc on the survivor path is an upper arc, the decoded bit is 1. After the decoded bit is output, the survivor paths at the states are truncated as shown in FIG. 3(e). The decoding of the rest of the codeword is continued similar to the above.

The process of finding the minimum metric is implemented in the invention using an efficient pipelined algorithm.

DESCRIPTION OF THE PREFERRED EMBODIMENT

In accordance with this invention, (1) the Viterbi algorithm is embedded in an architecture based on the De Bruijn Graph, (2) a binary tree is embedded within the De Bruijn graph to facilitate determination of the smallest metric, and (3) a pipelined algorithm is used for finding the smallest metric.

Figure 4:
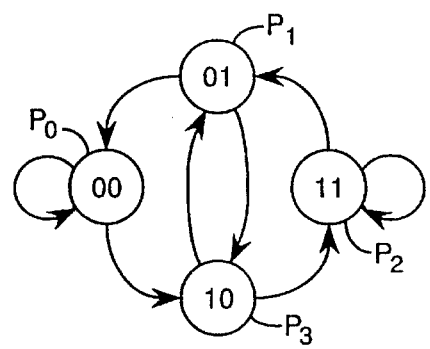
FIG. 4 illustrates a 4-node De Bruijn Graph.
Figure 5:
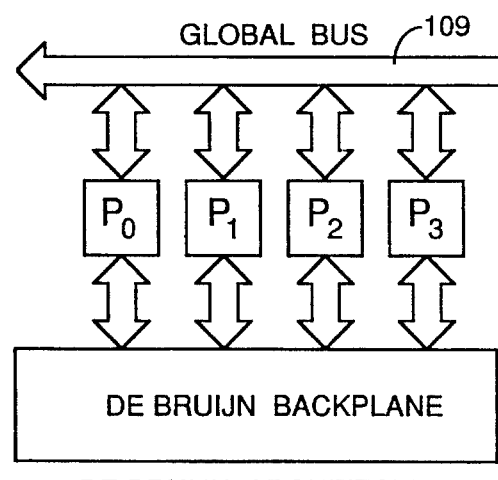
FIG. 5 illustrates the De Bruijn Architecture used in accordance with this invention.

A directed De Bruijn graph has $2^m$ nodes. Node $a_{m-1}a_{m-2}\ldots a_1a_0$ has arcs going out to nodes $a_0a_{m-1}a_{m-1}a_{m-2}\ldots a_2a_1$, $\bar{a}_0a_{m-1}a_{m-2}\ldots a_2a_1$. A De Bruijn graph of four nodes is shown in FIG. 4. In accordance with this invention, we use a De Bruijn architecture for Viterbi decoding of convolutional codes. The architecture uses processors connected with a De Bruijn network. FIG. 5 illustrates the architecture.

FIG. 4 illustrates a 4 node De Bruijn graph. Each of the nodes P0 to P3 corresponds to the four states 00, 01, 10, and 11 of the encoder, and the Viterbi decoder. It will be noted that each node has two inputs, and two outputs, as indicated by the arrows.

The topology of a binary directed De Bruijn network perfectly matches the communication requirements of the Viterbi algorithm for decoding convolutional codes, and hence is very suitable for implementation of a fast decoder.

The architecture for decoding a (n,l,m) convolutional code consists of $2^m$ processors connected by a De Bruijn network. Each processor is assigned the task of processing related to a state of the encoder. State $S_p$ of the Trellis of an (n,l,m) code is assigned to node $p_0p_1\ldots p_{m-1}p_{m-2}$ of the $2^m$-node De Bruijn graph, where $p_{m-1}p_{m-2}\ldots p_1p_0$ is the m-bit binary representation of number p. For example, consider the De Bruijn graph which consists of four nodes in FIG. 4 with each state of the Trellis of FIG. 2 assigned to one of the nodes. Observe that for every arc in the Trellis, there exists a connection in the De Bruijn graph between the corresponding nodes P0 to P3. For example, an arc exists in the Trellis-between states $S_0$ and $S_1$. Correspondingly, an arc exists between nodes 00 and 10 in the De Bruijn graph.

All of the processors are also connected to a global bus on which the code blocks are received for decoding by the processors: (i) To carry out the decoding (ii) To implement a search algorithm that searches survivor paths at all the states to find the survivor path with the smallest partial path metric.

FIG. 6 illustrates a processor of the De Bruijn architecture for decoding convolutional codes. Each processor is embedded in a node P0 to P3 and has two input ports 100 and 102 (SEA$^{-1}$ and SEAC$^{-1}$) and two output ports 104 and 106 (SEA$^{-1}$ and SEAC$^{-1}$). The n bit input/output register 108 (IOR) is used to access the global bus 109 (FIG. 5) on which the code blocks are received for decoding. The survivor path shift register 110 (SPSR) has r stages and is used to store partial estimates of the information sequence. The partial path metric register 112 (PPMR) is used to store partial metric for the survivor path entering the corresponding state. D (111) is a data bit buffer and M (113) is a metric buffer. Both buffers are used by the pipelined algorithm described later. The interconnections of the processor i are as follows:

SEA$_i$: input from processor j, where j is obtained by right shifting i

SEAC$_i$: input from processor j, where j is obtained by shifting i to the right and then complementing the least significant bit.

SEA$_i^{-1}$: output to processor j, where j is obtained b left shifting i

SEAC$_i^{-1}$: output to processor j, where j is obtained by shifting i to the left and then complementing the most significant bit.

The Viterbi algorithm described in the previous section is well-suited for parallel implementation on the De Bruijn architecture. Each processor of the architecture performs the steps related to a fixed state of the encoder. (Processor i corresponds to state $S_i$ of the encoder). The steps of the parallel algorithm are given below.

Algorithm for Processor i begin

Output PPRM 112 to SEA$_i^{-1}$ 106 and SEAC$_i^{-1}$/send the metric to the two neighbors/

Read SEA$_i$ and SEAC$_i$/read metric from two neighbors/

Read the next n bit block of code word from bus input IOR inc$_1$=weight (IOR XOR label (SEA$_i$))

inc$_2$=weight (IOR XOR label (SEAC$_i$))

temp$_1$=SEA$_i$+inc$_1$ temp$_2$=SEAC$_i$+inc$_2$ output contents of SPSR to SEA$_i^{-1}$ and SEAC$_i^{-1}$/ output the survivor path to the two neighbors/

PPMR=min (temp$_1$,temp$_2$)

if temp$_1$ is less than temp$_2$ then read SPSR from SEA$_i$ else from SEAC$_i$/ read survivor path from the neighbor with smaller metric/ shift the decoded data bit (corresponding to the chosen partial survivor path) into SPSR end The SPSR has a finite length r. Hence, after the first r blocks of the received sequence have been processed, a decoding decision must be made on the first information bit, since it can no longer be stored in the decoder's memory. There are several strategies for making this decision. Among these are:

An arbitrary supervisor is selected, and the first bit on this path is chosen as the decoded bit.

The survivor with the best metric is selected, and the first bit on this path is chosen as the decoded bit.

The first of the above schemes can easily be implemented by considering the overflow from the SPSR of, say processor 0, as the decoded information.

The second of the above schemes can be implemented by taking advantage of a binary tree embedded in the De Bruijn graph. This binary tree is used to find the survivor path with the smallest metric.

The De Bruijn graph provides an underlining interconnection structure for determining the smallest metric using a binary tree, as explained here.

A binary spanning tree can be embedded in a directed binary De Bruijn graph. FIG. 7 shows one such embedding in a 4-node De Bruijn graph. In a binary tree, each node has at most two children and one parent.

Many procedures are possible for embedding a binary tree into a De Bruijn graph. See the article by Samatham and Pradhan. One such procedure is described below. In the following procedure $(0)^b$ denotes a string of b 0's. For example, $(0)^3=000$. Also, $(x)^t$ denotes a strong of t bits. For example $(x)^2$ may denote any of four possible 2-bit strings: 00, 01, 10, 11.

00 . . . 0 or $(0)^m$ is the root of the binary tree.

Step 0: $(0)^{m-1}1$ is the child of node $(0)^m$.

Initialization: t=0.

Step 1: Let $j=(0)^{m-1-t}1(x)^t$.

Compute the following. Left child of $j=(0)^{m-1}-(t+1)_{1(x)}t_0$, and right child of $j=(0)^{m-1}-(t+1)_{1(x)}t_1$.

Step 2: Repeat Step 1 for all possible values of (x). There are $2^t$ possible values of $x^t$.

Step 3: If t=m−1 then STOP; otherwise increment t and go to Step 1.

Consider the example of FIG. 8 to see how the binary tree can be used to find the smallest metric. The pair $(S_p,a)$ inside a circle in FIG. 8 indicates that at state $S_p$ the survivor path metric is a. We need to find the minimum metric held by all the states. For this purpose, each node in the tree receives the metric from its children (if any). Then it passes onto its parent, the minimum of the metrics obtained from its children and the metric held by the node itself. When this process ends, the root of the tree outputs the smallest metric value.

The find the smallest metric without penalizing the performance, we use a pipelined algorithm. For this purpose, the size of SPSR buffer is augmented such that the nodes at level i have r+i stages in the SPSR register, leaf nodes being at level 0. Also the metrics are stored in a shift register called metric shift register. The length of this shift register is i+1 for a node at level i. This shift register is clocked once during each cycle, so a metric shifts out of the register each cycle.

Each processor has buffers M and D for storing a metric and a data bit temporarily. During every cycle of the algorithm, each processor (except leaf processor) transmits the contents of M and D to its parent. The contents of M and D are obtained as follows:

During each cycle, the contents of the metric shift register and SPSR registers are shifted as new values are shifted in. Due to overflow, a value is shifted out from both metric shift register and SPSR. We refer to the overflow value from the metric shift register by $metric_o$ and the overflow from SPSR by $spsr_o$.

Each leaf node transmits its PPMR and the bit shifted out of its SPSR to its parent. Also each node (except those at the leaves) reads two metrics and data bits from its leaves. Consider the node corresponding to the state $S_p$. This node evaluates the smallest of the two metrics received from its children and $metric_o$ for this state. It stores the smallest metric in M and the decoded bit corresponding to that survivor path in D.

In the following, we describe the steps performed to obtain the minimum metric and the decoded data. During each cycle, the contents of the D register output by root of the binary tree constitutes decoded information.

Node i of the decoder executes the following steps in each iteration after the steps described earlier.

output metric M and data D to the parent node
if i is NOT a leaf node then begin
input the metrics from the children
M=minimum ($metric_o$, the metrics received from the children)
If M=$metric_o$ then D=$spsr_o$ else D is set to the data value received from that child for which the metric received is equal to M
end
if i is a leaf node then begin
M=$metric_o$
S=$spsr_o$
end The above steps are illustrated by the example of FIG. 8.

The topology of a directed De Bruijn graph exactly matches computational requirement of the Viterbi algorithm and hence is very suitable for implementation of a fast decoder.

It will be apparent to persons skilled in the art that this invention is subject to various modifications and adaptations. It is intended therefore, the invention be limited only by the appended claims, as interpreted in the light of the prior art.

What is claimed is:

1. A system for decoding a convolutional code (n, k, m), where k is the input, n is the output and m is the input memory, said code being supplied to a generator matrix $G(D)=(1+D, 1+D^2, +D+D_2)$ where D and D2 are delay elements equal in number to m, comprising:

a DeBruijn graph having $2^m$ nodes, each of said nodes corresponding to one of four states 00, 01, 10, and 11 of a Viterbi decoder, each of said nodes having one input and two outputs, wherein k=1, m=2 and n=3.0;

a plurality of Viterbi trellis decoders for decoding said convolutional code, one trellis decoder being embedded in each of said nodes, each trellis decoder having a plurality of arcs, every arc in the trellis of each Viterbi decoder providing a connection corresponding to each of said nodes.

\* \* \* \* \*